United States Patent [19]
Takeuchi

[11] Patent Number: 5,793,078
[45] Date of Patent: Aug. 11, 1998

US005793078A

[54] NON-VOLATILE SEMICONDUCTOR MEMORY DEVICE AND METHOD OF FABRICATING THEREOF

[75] Inventor: Nobuyoshi Takeuchi, Tokyo, Japan

[73] Assignee: NKK Corporation, Tokyo, Japan

[21] Appl. No.: 859,775

[22] Filed: May 21, 1997

Related U.S. Application Data

[63] Continuation of Ser. No. 565,166, Nov. 30, 1995, abandoned.

[30] Foreign Application Priority Data

Nov. 30, 1994 [JP] Japan .................................. 6-296229
Oct. 30, 1995 [JP] Japan .................................. 7-281999

[51] Int. Cl.$^6$ ........................... H01L 29/76; H01L 29/788
[52] U.S. Cl. .................................... 257/315; 257/316
[58] Field of Search ............................. 257/202, 204, 257/314, 315, 321, 391, 392, 909, 316

[56] References Cited

U.S. PATENT DOCUMENTS

| | | | |
|---|---|---|---|
| 4,223,394 | 9/1980 | Pathak et al. | 365/210 |
| 4,811,291 | 3/1989 | de Ferron | 365/185 |
| 4,833,514 | 5/1989 | Esquivel et al. | 357/23.5 |
| 5,068,697 | 11/1991 | Noda et al. | 357/23.5 |
| 5,142,496 | 8/1992 | Van Buskirk | 365/201 |
| 5,157,626 | 10/1992 | Watanabe | 365/185 |
| 5,163,021 | 11/1992 | Mehrotra et al. | 365/185 |
| 5,311,466 | 5/1994 | Natale et al. | 365/185 |
| 5,349,558 | 9/1994 | Cleveland et al. | 365/200 |
| 5,463,587 | 10/1995 | Maruyama | 365/210 |
| 5,465,231 | 11/1995 | Ohsaki | 365/185.33 |
| 5,545,906 | 8/1996 | Ogura et al. | 257/315 |
| 5,568,418 | 10/1996 | Crisenza et al. | 365/185.01 |

OTHER PUBLICATIONS

Seiji Yamada et al., "A Self–Convergence Erasing Scheme for a Simple Stacked Gate Flash EEPROM", *IEEE*, vol. 11, No. 4, pp. 1–4, 1991.

*Primary Examiner*—Wael Fahmy
*Assistant Examiner*—Howard Weiss
*Attorney, Agent, or Firm*—Nixon & Vanderhye P.C.

[57] ABSTRACT

According to the present invention, there is provided a non-volatile semiconductor memory device including a memory cell array in which a plurality of memory cells are arranged, wherein the memory cells contain two or more types of memory cells, which differs in gate couple ratio. Each memory cell includes source-drain regions provided apart from each other in a semiconductor substrate having a conductivity type, the source-drain regions having a conductivity type opposite to that of the semiconductor substrate, a floating gate provided above a channel region formed between the source-drain regions, and a control gate provided above a surface of the floating gate, and the memory cells contain two or more types of memory cells, which differ in relation to an area of a region in which the floating gate and the control gate overlap. The memory cells having a low gate couple ratio exhibit characteristics similar to those of a mask ROM, which gives priority to reading, whereas the memory cells having a high gate couple ratio, exhibit excellent programming and erasing characteristics.

27 Claims, 4 Drawing Sheets

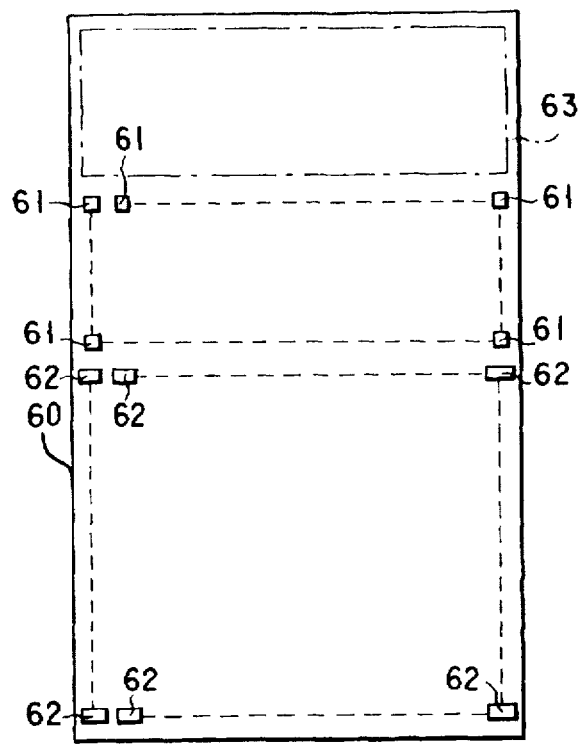
F I G. 6
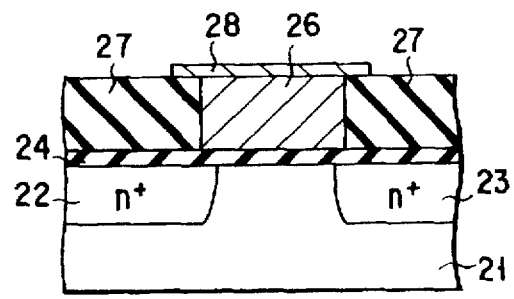
F I G. 7A
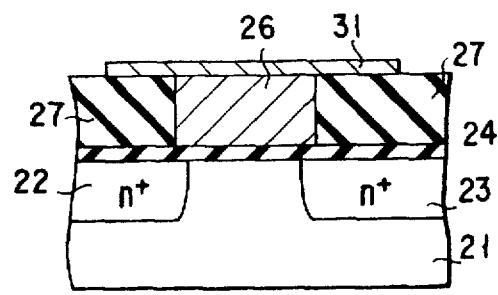
F I G. 7B
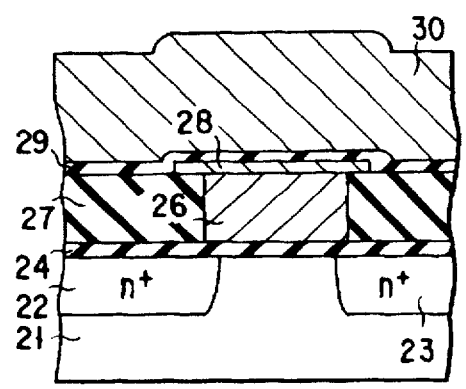
F I G. 8A
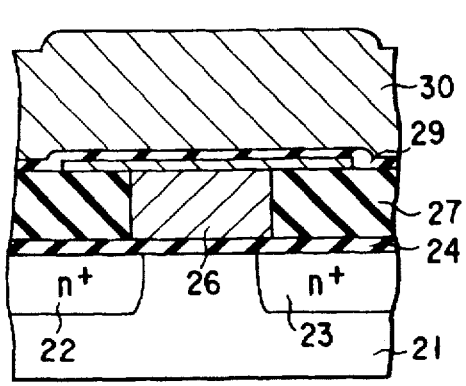
F I G. 8B

NON-VOLATILE SEMICONDUCTOR MEMORY DEVICE AND METHOD OF FABRICATING THEREOF

This is a continuation of application Ser. No. 08/565,166, filed Nov. 30, 1995, now abandoned.

BACKGROUND OF THE INVENTION

1. Field of the Invention

The present invention relates to a non-volatile semiconductor memory device.

2. Description of the Related Art

A memory cell can be defined as a circuit of a minimum unit, for storing data in a semiconductor memory device A memory cell consists of a transistor and a capacitor in combination. A normal semiconductor memory device is required to achieve as small distribution of memory data as possible, its memory cell array consists of a plurality of memory cells of the same type and the same size, so as to obtain as uniform characteristics as possible.

In accordance with an increase in the degree of integration of a semiconductor memory device, there is a tendency for a semiconductor memory device to be required to have not only a function as a mere memory medium but also a function of systematic operation coupled with a CPU. Such a tendency is particularly prominent in a non-volatile semiconductor memory device such as an EPROM, EEPROM or flash memory.

In reply to such requirements, it is proposed that a memory cell array of a semiconductor memory device is divided into a plurality of blocks, which are allowed to have different functions from each other, for example, as in a bestblock mode of Intel Co. In this mode, the blocks have different functions from each other, and therefore the characteristics required from memory cells are different from one block to another. More specifically, a block in which a basic code such as for standing a system is input, involves a less number of times of rewriting of data, and therefore is required to have memory cells of a mask ROM type, whereas a block in which data is frequently rewritten, requires to have memory cells having excellent programming characteristics.

However, in a conventional semiconductor memory device, a memory cell array consists of memory cells which have the same characteristics. Consequently, a variety of requests as mentioned above cannot be satisfied in the case where memory cells are formed to have the characteristics suitable for one block, these memory cells may cause a trouble in another block. For example, in the case where all the memory cells of a memory cell array is formed to have a large gate couple ratio, so as to improve the programming characteristics, those memory cells which belong to a block used for inputting a basic code, axe easily exposed to problems such as gate-disturb and soft-write.

SUMMARY OF THE INVENTION

The object of the present invention is to provide a non-volatile semiconductor memory device which can perform different functions without occurring problem and the method of fabricating thereof.

According to the present invention, there is provided a non-volatile semiconductor memory device comprising a memory cell array in which a plurality of memory cells are arranged, wherein the plurality of memory cells contain two or more types of memory cells, which differs in gate couple ratio.

According to the present invention, there is provided a non-volatile semiconductor memory device comprising a memory cell array in which a plurality of memory cells are arranged, wherein the memory cell array includes at least two memory cell groups each consisting of a plurality of memory cells, and the at least two memory cell groups differ from each other in relation to a gate couple ratio of the memory cell.

According to the present invention, there is provided a non-volatile semiconductor memory device comprising a memory cell array in which a plurality of memory cells are arranged, wherein the memory cell array is divided into a plurality of blocks, and memory cells formed in a block of the plurality of blocks differ from memory cells formed in another block in relation to gate couple ratio.

According to the present invention, there is provided a method of fabricating a non-volatile semiconductor memory device comprising a memory cell array in which a plurality of memory cells are arranged the plurality of memory cells having different gate couple ratios, the method comprising the steps of: forming a first gate insulation film on a semiconductor substrate of one conductivity type; forming a first conductive film on the first gate insulation film; etching the first conductive film to form first conductive file portions which give rise to a plurality of floating gates; forming source-drain regions for each of the plurality of memory cells, on a main surface of the semiconductor substrate; forming an interlayer-dielectric both on the semiconductor substrate and on the floating gate; etching the interlayer-dielectric to expose the surface on the floating gates; forming a second conductive film on the interlayer dielectric including the surfaces of the floating gates; etching the second conductive film by photolithography with use of a mask in which formed a plurality of openings, the openings contain at least two type having different areas, so as to form a plurality of caps which contain at least two type having different areas, on the floating gate, areas of the caps are larger than that of respective one of the floating gates; forming second gate dielectric films on the caps; and forming third conductive films which give rise to control gates, on the second gate dielectric film.

According to the present invention, there is provided a method of manufacturing a non-volatile semiconductor memory device comprising a memory cell array in which a plurality of memory cells are arranged, the plurality of memory cells having different gate couple ratios, the method comprising the steps of: forming a first gate insulation film on a semiconductor substrate of one conductivity type; forming source-drain regions for each of the plurality of memory cells on a main surface of the semiconductor substrate; forming a first conductive film on the first gate insulation film; etching the first conductive film by photolithography with use of a mask in which formed a plurality of openings, the openings contain at least two type having different areas, so as to form a plurality of floating gates which contain at least two type having different areas; forming a second gate insulation film on the semiconductor substrate; and forming a second conductive film which give rise to a control gate, on the second gate insulation film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a plan view showing a mask used in the method of fabricating an non-volatile semiconductor memory device shown in FIG. 1;

FIGS. 7A and 7B are cross sections each illustrating a step in an example of the method of fabricating an non-volatile semiconductor memory device shown in FIG. 1;

FIGS. 8A and 8B are cross sections each illustrating a step in an example of the method of fabricating an non-volatile semiconductor memory device shown in FIG. 1;

DETAILED DESCRIPTION OF THE PREFERRED EMBODIMENTS

Embodiments of the present invention will now be described with reference to accompanying drawings.

Figure 1:
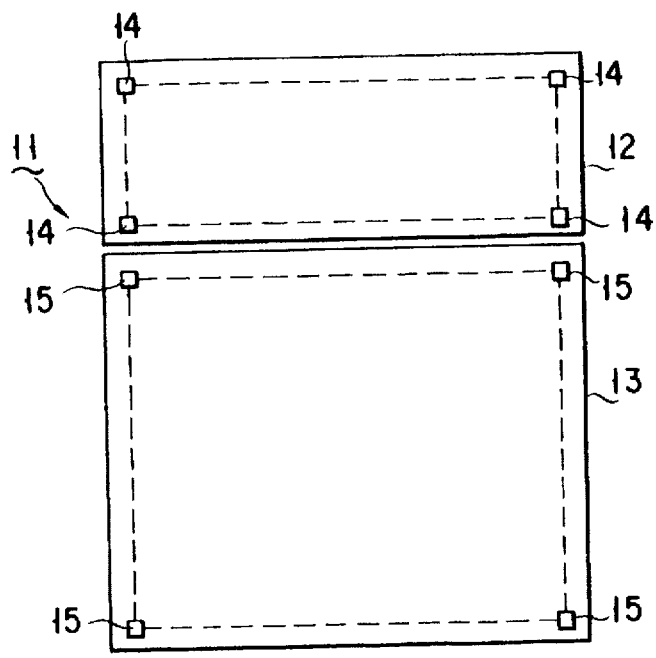
FIG. 1 is a schematic diagram showing a non-volatile semiconductor memory device according to the first embodiment of the present invention.

FIG. 1 is a schematic diagram showing a non-volatile semiconductor memory device according to the first embodiment of the present invention. In this figure, reference numeral 11 denotes a memory cell array. The memory cell array 11 is divided into a first block 12 and a second block 13.

Figure 2:
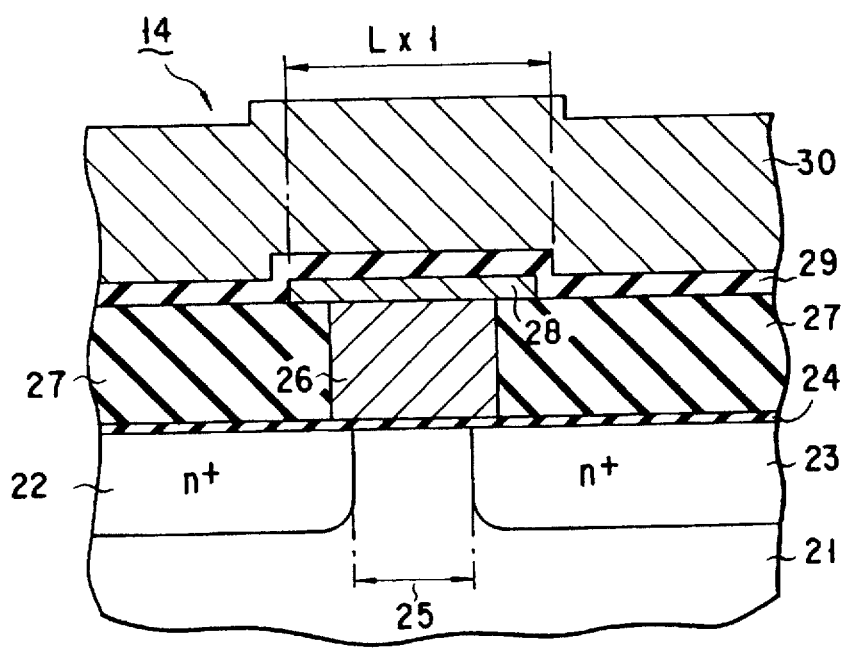
FIG. 2 is a cross section showing a first type memory cell of the non-volatile semiconductor memory device shown in FIG. 1.

In the first block 12, a plurality of first type memory cells 14 are formed in a matrix manner. FIG. 2 is a cross section of a first type memory cell 14. In this figure, reference numeral 21 is a P-type silicon substrate. In the P-type silicon substrate 21, a source region 22 and a drain region 23, which are high-concentration impurity diffusion regions ($n^+$) formed by doping n-type impurities thereto, are formed. On a surface of the silicon substrate 21 including the source region 22 and the drain region 23, a tunnel oxide film 24 is formed. On a part of the surface of the tunnel oxide film 24, which is located above a channel region 25 between the source region 22 and the drain region 23, a floating gate 26 made of polysilicon is formed. On the portions, other than the portion of the tunnel oxide 24 on which the floating gate 26 is formed, an interlayer dielectric 27 made of a silicon oxide is formed.

A cap 28 made of polysilicon is formed so as to cover the entire exposed surface of the floating gate 26 and partially cover the regions above the source region 22 and the drain region 23. The cap 28 has a length Lx1 taken along the direction in which the source region 22 and the drain region 23 are disposed (to be called the X-directional length hereinafter) and a length Ly1 taken along the direction normal to the direction in which the source region 22 and the drain region 23 are disposed (to be called the Y-directional length hereinafter). Therefore, an area S1 of the cap 28 having a substantially rectangular shape can be obtained from Lx1×Ly1.

On the surface of the interlayer dielectric 27 including the cap 28, an ONO film 29 which is a lamination of silicon oxide/silicon nitride/silicon oxide in this order, is formed. A control gate 30 made of polysilicon is formed on the surface of the ONO film 29.

Figure 3:
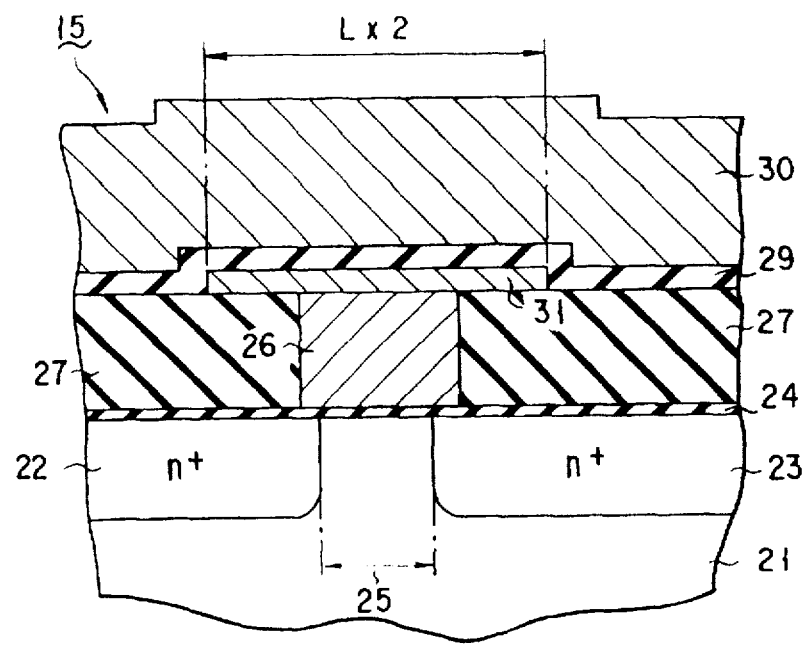
FIG. 3 is a cross section showing a second type memory cell of the non-volatile semiconductor memory device shown in FIG. 1.

In the second block 13, a plurality of second type memory cells 15 are formed in a matrix. FIG. 3 is a cross section of a second memory cell 15. Each second type memory cell 15 has a similar structure to that of the first type memory cell 14 shown in FIG. 2, except for the size of a cap 31 made of polysilicon, which is formed so as to cover the entire exposed surface of a floating gate 26 and to partially cover the regions on the surface of an interval dielectric film 27 and above a source region 22 and a drain region 23.

The cap 31 has an X-directional length Lx2, which is longer than the X-directional length Lx1 of the cap 28 of the first memory cell 14. The Y-directional length Ly2 of the cap 31 is the same as the Y-directional length Ly1 of the cap 28 of the first memory cell 14. An area S2 of the cap 31 having substantially a rectangular shape can be obtained by Lx2×Ly2, and is larger than the area S1 of the cap 28 of the first memory cell 14.

Each of the gate couple ratios of the first memory cell 14 and the second memory cell 15 becomes larger as the capacitance between the channel region 25 and the floating gate 26 and the capacitance between the floating gate 26 and the control gate 30 become larger. The first memory cell 14 and the second memory cell 15 are equal to each other in relation to the area in which the channel region 25 and the floating gate 26 overlap with each other, and therefore the capacitance between the channel region 25 and the floating gate 26 is constant. In contrast, the capacitance between the floating gate 26 and the control gate 30 becomes larger as the area in which the floating gate 26 and the control gate 30 overlap with each other (to be called as overlapping area hereinafter) becomes larger. The overlapping area of the first memory cell 14 and the second memory cell 15 is determined by the area S1 or S2 of the cap 28 or 31, since the control gate 30 covers the cap 28 or 31 in its entirety. The Y-directional lengths Ly1 and Ly2 of the caps 28 and 31 are equal to each other, and therefore the areas S1 and S2 increase in proportional to the X-directional lengths Lx1 and Lx2 of the caps 28 and 31.

With regard to the area S1 of the cap 28, the length Lx1 of the cap 28 is relatively short, and therefore the area S1 of the cap 28 is small. Therefore, the overlapping area in which the cap 28 which is a part of the floating gate 26 and the control gate 30 overlap with each other, is relatively small, and therefore the capacitance between the floating gate 26 and the control gate 30 is small. Consequently, the gate couple ratio of the first memory cell 14 is small, thereby achieving mask ROM type characteristics, which give priority to read-out of data.

Meanwhile, with regard to the second type memory cell 15, the length Lx2 of the cap 31 is long, and therefore the area S2 of the cap 31 is large. Consequently, the overlapping area in which the cap 28 which is a part of the floating gate 26 and the control gate 30 is large. Consequently, the capacitance between the floating gate 26 and the control gate 30 becomes large. As a result, the gate couple ratio of the second memory cell 15 is rendered small, thereby achieving excellent programming characteristics and erasing characteristics.

As described above, the non-volatile semiconductor memory device of this embodiment has a structure in which the first memory cell 14 and the second memory cell 15, which have difference characteristics from each other, are formed in the first block 12 and the second block 13. Thus, the first memory cell 14 of the first block 12 has mask ROM characteristics, and therefore a disturbance of read-out rarely occurs in the first block 12. Further, rewriting in the second block 13 is carried out with priority, and therefore a long-term error such as the disturbance of read-out does not substantially occur as a problem. Therefore, the second memory cell 15 can increase its gate couple ratio, and improve the write-erase characteristics.

Figure 4A:
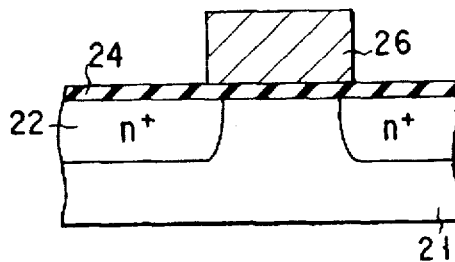
FIGS. 4A and 4B are cross sections each illustrating a step in an example of the method of fabricating an non-volatile semiconductor memory device shown in FIG. 1.
Figure 4B:
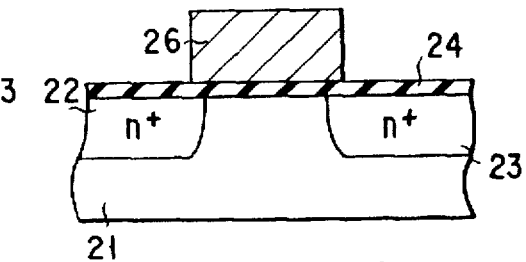
Figure 5A:
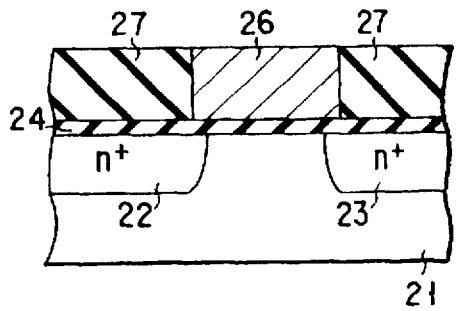
FIGS. 5A and 5B are cross sections each illustrating a step in an example of the method of fabricating an non-volatile semiconductor memory device shown in FIG. 1.
Figure 5B:
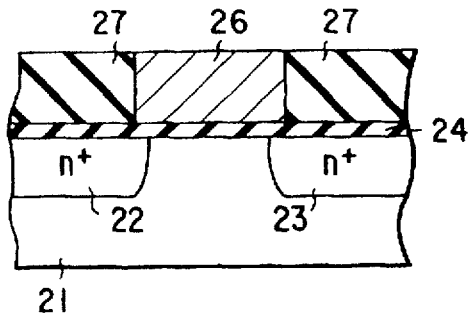

Embodiment of the method of fabricating the non-volatile semiconductor memory device of the first embodiment of the present invention will now be described with reference to FIGS. 4 to B. FIGS. 4A, 5A, 7A and 8B show steps of fabricating the first type memory cells 14 of the first block 12, and FIGS. 4B, 5B, 7B and 8B show steps of fabricating the second type memory cells 15 of the second block 15.

First, as shown in FIG. 4, a tunnel oxide 24 is formed on the surface of a p-type silicon substrate 21, and a first poly-silicon film for floating gate is formed on top of that. The first poly-Si film is etched by a conventional photolithography process, and floating gates 26 corresponding to the memory cells 14 and 15 are formed. Next, with ion implantation, the source 22 and the drain 23 for each of the reference cells 14 and 15 are formed on the main surface of the silicon substrate 21.

Next, as shown in FIG. 5, after forming a silicon oxide film on the entire surface of the silicon substrate 21, the surface is etched back, thus obtaining an interlayer dielectric 27 between adjacent floating gates 26 of each of the memory cells 14 and 15.

Subsequently, a second poly-Si film is formed on the entire surface of the interlayer dielectric 27 including the exposed surfaces of the floating gates then, the second poly-Si film is etched by photolithography with use of a mask 60 shown in FIG. 6, having a plurality of opening portions 61 and 62 corresponding to the caps 28 and 31 of the memory cells 14 and 15. The areas of opening portions 61 and 62 corresponding the caps 29 and 31 are different. Thus, caps 28 and 31 having different areas are formed so as to protrude from the floating gates 26 as shown in FIG. 7. Note that a mask pattern 63 used for forming the logic portion, is formed also on the mask 60.

Subsequently, as shown in FIG. 8, an ONO film 29 is formed on the interlayer dielectric 27 including the caps 28 and 31, and a control gate made of polysilicon is formed on the ONO film 29.

With the above-described process, a non-volatile semiconductor memory device including the first memory cells 14 and the second memory cells 15 having different gate couple ratios, can be formed.

As described above, with the method of fabricating a non-volatile semiconductor memory device, according to this embodiment, memory cells can be fabricated to have caps formed on the floating gates 26 of these cells, which differ from one cell to another in X-directional length. Therefore, memory cells which differs from each other in gate couple ratio can be manufactured. Consequently, with use of the mask 60 used to form the caps 28 and 31, and having openings corresponding to these caps 28 and 31 and differing in X-directional length between the first block 12 and the second block 13, the mask being used to form the floating gate 38, the first block 12 and the second block 13 can be formed with memory cells of different characteristics at the same time without increasing the number of steps in the manufacture of regular memory cells In other words, for example, a cap made of a is conductive material and having an area larger than the area of the floating gate is provided on the surface of the floating gate, and the area of the cap is varied, and thus the overlapping area between the cap and the control gate portion is varied.

Figure 9:
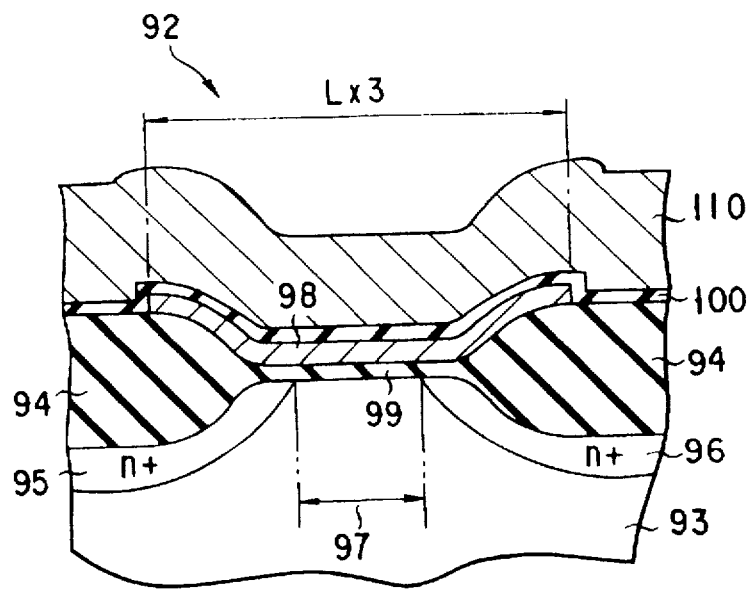
FIG. 9 is a cross section showing a different version of a memory cell of the non-volatile semiconductor memory device of the present invention.

In place of the first and second memory cells 14 and 15 having the caps 28 and 31, a memory cell capable of changing the gate couple ratio by varying the area of the floating gate, such as shown in FIG. 9, may be used. In the memory cell 92, a silicon oxide film 94 is formed on the surface of the silicon substrate 93. Underneath the silicon oxide film 94, the source region 95 and the drain region 96 are formed on the surface of the silicon substrate 93 so that parts of these regions are exposed. On the surface of the channel region 97, which is defined by the source region 95 and the drain region 96, a floating gate 98 made of poly-silicon is formed via a tunnel oxide film 99 so as to cover the exposed surfaces of the source region 95 and the drain region 96, and a part of the silicon oxide film 94. On the surfaces of the floating gate 98 and the silicon oxide film 94, an ONO film 100 is formed. On the surface of the ONO film 100, a control gate 101 is formed.

In the memory cell 92 having the above-described structure, the gate couple ratio can be varied by changing the length Lx3 of the floating gate 38, which is taken along the direction in which the silicon oxide films 94 are arranged. More specifically, the floating gate 98 covers the entire channel region 97, and therefore regardless of the length Lx3 of the floating gate 98, the area in which the floating gate 98 and the channel region 97 overlap with each other is constant. Consequently, the capacitance between the floating gate 98 and the channel region 97 is constant. Meanwhile, as the length Lx3 of the floating gate 98 is varied, the area in which the floating gate 98 and the control gate 101 overlap with each other varies. Accordingly, the capacitance between the floating gate 98 and the control gate 41 varies. Thus, by changing the length Lx3 of the floating gate 98, the capacitance between the floating gate 98 and the control gate 101 can be varied and the gate couple ratio of the memory cell 92 can be varied.

With regard to the first block 12 shown in FIG. 1, the length Lx3 of the floating gate 98 is shortened so as to decrease the gate couple ratio, thus achieving the memory cells having characteristics similar to those of a masked MOS with priority for read out. In contrast, with regard to the second block 13, the length Lx3 of the floating gate 98 is increased so as to increase the gate couple ratio, thus achieving the memory cells having excellent programming characteristics with priority for rewrite. As just mentioned, even in the case where a memory cell 92 of such a remodeled version is used, memory cells having characteristics suitable for different functions can be formed in blocks by the different functions.

With the regard to the non-volatile semiconductor memory device according to the second aspect of the present invention, it suffices only if a mask with a plurality of openings corresponding to the floating gates of memory cells, which differs in area between the first block 12 and the second block 13, is used for forming the floating gates, and it is not necessary to add any further complicated means.

More specifically, first, a tunnel oxide film 99 is formed on the surface of a p-type silicon substrate 93, and the first polysilicon film for a floating gate is formed on top of that. Then, the first polysilicon film is etched by the photolithography process with use of a mask with a plurality of openings corresponding to floating gates of the memory cells 92, which differs in area between the first block 12 and the second block 13, thus forming floating gates 98 corresponding to the memory cells.

Next, the formation of a diffusion region, an interlevel dielectric film and a control gate, is carried out by an ordinary process, thus completing a non-volatile semiconductor memory device according to the embodiment.

With use of the mask 60 used to pattern the floating gates, which differs in length Lx3 between the first block 12 and the second block 13, the first block 12 and the second block 13 can be formed with memory cells of different characteristics without increasing the number of steps in the manufacture of regular memory cells.

Figure 10:
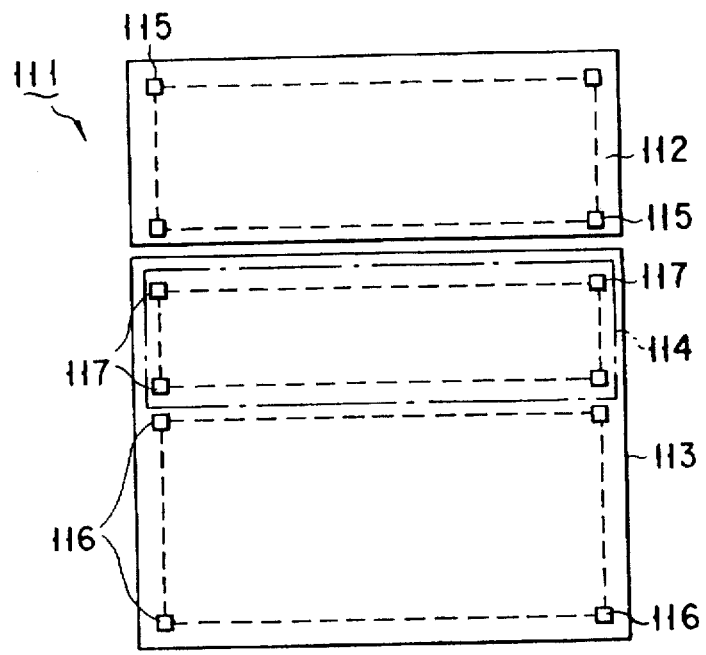
FIG. 10 is a schematic diagram showing a non-volatile semiconductor memory device according to the second embodiment of the present invention.

The memory cell array 11 can be divided into not only two blocks as mentioned above, but also into three or more blocks in accordance with required functions. Further, as shown in FIG. 10, it is possible that the memory cell array 111 is divided into two blocks, the first and second blocks 112 and 113, and a sub-block 114 is formed in the second block 113. The first and second blocks 112 and 113 and the sub-block 114 respectively contain memory cells 115, 116 and 117 which are formed in matrix shapes. Each of the memory cells consists of the first type memory cell 14 having a cap 28 shown in FIG. 2. In each of the memory cells 114 of the first block 112, the length of the cap is made relatively short and the gate couple ratio is made small, so as to obtain characteristics similar to those of a masked RON with priority for read out. In the memory cells 116 which are formed in the second block 113 but outside the sub-block 114, the length of the cap is made relatively long and the gate couple ratio is made large so as to obtain programming and delete characteristics with priority for rewrite. The memory cells 117 formed in the sub-block 114 have characteristics inbetween those of the memory cells 115 and 116 of the first and second blocks 112 and 113. Therefore, the length of the caps of the memory cells 117 is an intermediate of both, and so is the gate couple ratio.

In the above cases, each of the blocks 112 and 113 can be handled independently of each other using the wells or source regions of the blocks 112 and 113 in common. Consequently, the conductivity type of the impurity which is doped in the memory cells 115 need not be made different from the block 112 to the block 113.

However, it is possible that the well separation region or the block separation region increases, and the area of the chip accordingly increases. Such a drawback becomes further prominent especially when the size of one block becomes small. In order to avoid this, the memory cell array 111 should be divided into blocks not in the manner that a memory cell group in which the wells or source regions of the cells are used in common, is regarded as one unit, but in the manner that a memory cell group having necessary characteristics is used as one unit. In this way, the well separation region or the block separation region is not increased. In the above-described sub-block 114, the wells and source regions are used in common with those of the second block 113, and therefore the well separation region or the block separation region is not necessary. Although the case where the length of the X direction of the cap is larger than that of the floating gate has been described in the above embodiments, it is intended to exclude from the scope of the present invention neither the case the length of the X direction of the cap is smaller than that of the floating gate, nor the case the cap is not rectangular.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A non-volatile semiconductor memory device comprising a memory cell array in which a plurality of memory cells is arranged, said memory cells each comprising source-drain regions provided apart from each other in a semiconductor substrate having a conductivity type, said source-drain regions having a conductivity type opposite to that of the semiconductor substrate, a floating gate provided above at least a channel region disposed between said source-drain regions, and a control gate provided above a surface of said floating gate, wherein there exists a difference between one memory cell and another memory cell in area of the floating gate covering said semiconductor substrate, which causes a difference therebetween in gate couple ratio.

2. A non-volatile semiconductor memory device comprising a memory cell array in which a plurality of memory cells is arranged, said memory cell array including at least two memory cell groups, each group comprising a plurality of memory cells, each memory cell comprising source-drain regions provided apart from each other in a semiconductor substrate having a conductivity type, said source-drain regions having a conductivity type opposite to that of the semiconductor substrate, a floating gate provided above at least a channel region disposed between said source-drain regions, and a control gate provided above a surface of said floating gate, wherein there exists a difference between one memory cell and another memory cell in area of the floating gate covering said semiconductor substrate, which causes a difference therebetween in gate couple ratio.

3. A device according to claim 2, wherein each of said plurality of memory cells further comprises a cap made of a conductive material, formed on said floating gate, and having an area larger than an area of said floating gate, and a control gate provided above said cap, and said memory cell groups differ in relation to an area of said cap.

4. A device according to claim 3, wherein each of said caps of memory cells is made of the same conductive material layer.

5. A non-volatile semiconductor memory device comprising a memory cell array in which a plurality of memory cells is arranged, said memory cell array being divided into a plurality of blocks, each memory cell comprising source-drain regions provided apart from each other in a semiconductor substrate having a conductivity type, said source-drain regions having a conductivity type opposite to that of the semiconductor substrate, a floating gate provided above at least a channel region disposed between said source-drain regions, and a control gate provided above a surface of said floating gate and being formed in a block of said plurality of blocks, wherein a first memory cell differs from a second memory cell in area of the floating gate covering said semiconductor substrate; and wherein the first memory cell is substantially the same as the second memory cell in channel length as defined between the source-drain region.

6. A device according to claim 5, wherein each of said memory cells further comprises a cap made of a conductive material, formed on said floating gate, and having an area larger than an area of said floating gate, and a control gate provided above said cap, and said memory cell groups differ in relation to an area of said cap.

7. A device according to claim 5, wherein a block is formed as one unit consisting of a plurality of memory cells which uses wells or source regions in common.

8. A device according to claim 5, wherein a block is formed as one unit consisting of a plurality of memory cells which have same characteristics.

9. A non-volatile semiconductor memory device comprising a memory cell array in which a plurality of memory cells is arranged, wherein said plurality of memory cells contains two or more types of memory cells, each of which comprises source-drain regions provided apart from each other in a semiconductor substrate having a conductivity type, said source-drain regions having a conductivity type opposite to that of the semiconductor substrate, a floating gate provided above a channel region disposed between said source-drain regions, a cap made of a conductive material, formed on said floating gate, and having an area larger than an area of said floating gate, and a control gate provided above said cap, and which differs in gate couple ratio in accordance with a difference in an area of said cap.

10. A non-volatile semiconductor memory device comprising a memory cell array in which a plurality of memory cells is arranged, said plurality of memory cells containing two or more types of memory cells, each memory cell comprising source-drain regions provided apart from each other in a semiconductor substrate having a conductivity type, said source-drain regions having a conductivity type opposite to that of the semiconductor substrate, a floating gate provided above a channel region disposed been said source-drain regions, so as to cover a part of or the entire source-drain regions, and a control gate provided above a surface of said floating gate, wherein a first memory cell differs from a second memory cell in area of the floating gate covering said semiconductor substrate; and wherein the first memory cell is substantially the same as the second memory cell in channel length as defined between the source-drain region.

11. A non-volatile semiconductor memory device comprising a memory cell array in which a plurality of memory cells is arranged, wherein said memory cell array includes at least two memory cell groups each comprising a plurality of memory cells, each of which comprises source-drain regions provided apart from each other in a semiconductor substrate having a conductivity type, said source-drain regions having a conductivity type opposite to that of the semiconductor substrate, a floating gate provided above a channel region disposed between said source-drain regions, a cap made of a conductive material, formed on said floating gate, and having an area larger than an area of said floating gate, and a control gate provided above said cap, and which differ in gate couple ratio in accordance with a difference in an area of said cap.

12. A device according to claim 11, wherein each of said caps of memory cells is made of the same conductive material layer.

13. A non-volatile semiconductor memory device comprising a memory cell array in which a plurality of memory cells is arranged, said memory cell array including at least two memory cell groups each comprising a plurality of blocks, each memory cell comprising source-drain regions provided apart from each other in a semiconductor substrate having a conductivity type, said source-drain regions having a conductivity type opposite to that of the semiconductor substrate, a floating gate provided above a channel region disposed between said source-drain regions, so as to cover a part of or the entire source-drain regions, and a control gate provided above a surface of said floating gate, wherein a first memory cell is substantially the same as a second memory cell in structure other than that the first memory cell differs from the second memory cell in area of the floating gate covering said semiconductor substrate.

14. A non-volatile semiconductor memory device comprising a memory cell array in which a plurality of memory cells is arranged, wherein said memory cell array is divided into a plurality of blocks, and memory cells, each of which memory cells comprises source-drain regions provided apart from each other in a semiconductor substrate having a conductivity type, said source-drain regions having a conductivity type opposite to that of the semiconductor substrate, a floating gate provided above a channel region disposed between said source-drain regions, a cap made of a conductive material, formed on said floating gate, and having an area larger than an area of said floating gate, and a control gate provided above said cap, which memory cells are formed in a block of said plurality of blocks, and wherein memory cells formed in one block differ from memory cells formed in another block in gate couple ratio in accordance with a difference in an area of said floating gate.

15. A non-volatile semiconductor memory device comprising a memory cell array in which a plurality of memory cells is arranged, said memory cell array being divided into a plurality of blocks, each block including two or more memory cells each comprising source-drain regions provided apart from each other in a semiconductor substrate having a conductivity type, said source-drain regions having a conductivity type opposite to that of the semiconductor substrate, a floating gate provided above a channel region disposed between said source-drain regions, so as to cover a part of or the entire source-drain regions, and a control gate provided above a surface of said floating gate, wherein there exists a difference between memory cells formed in one block and memory cells formed in another block in area of the floating gate covering said semiconductor substrate, which difference in area of the floating gate causes a difference between said memory cells in gate couple ratio.

16. A non-volatile semiconductor memory device comprising a memory cell array, wherein said memory cell array comprises a primary memory cell block in which memory cells are arranged, each memory cell comprising source-drain region apart from each other in a semiconductor substrate, a floating gate provided above a channel region disposed between said source-drain region and a control gate provided above said floating gate, wherein there exists a difference between one memory cell and another memory cell in area of the floating gate covering said semiconductor substrate, which difference in area of floating gate causes a difference between said memory cells in gate couple ratio.

17. A device according to claim 16, wherein said primary memory cell block consists of at least two memory cell groups, each containing memory cells having the same coupling ratio within their group, and the gate couple ratio differing from one memory cell group to another memory cell group.

18. A device according to claim 16, wherein said primary memory cell block consists of a plurality of secondary memory cell blocks, each containing memory cells having the same coupling ratio within their block, and the gate couple ratio differing from one secondary memory cell block to another secondary memory cell block.

19. A device according to claim 18, wherein at least one of said plurality of secondary memory cell blocks contain a tertiary memory cell block, and wherein the gate couple ratio of memory cells formed within said tertiary memory cell block differs from the gate couple ratio of memory cells formed within said secondary memory cell block but outside said tertiary memory cell block.

20. A device according to claim 16, wherein said primary memory cell block comprises at least one secondary memory cell block and wherein memory cells in said at least one secondary memory cell block differ in gate couple ratio from those in other than said at least one secondary memory cell block.

21. A device according to claim 18, wherein said secondary memory cell block is formed as one unit consisting of a plurality of memory cells which uses wells or source in common.

22. A device according to claim 18, wherein said secondary memory cell block is formed as one unit consisting of a plurality of memory cells which have same characteristics.

23. A device according to claim 18, wherein said primary memory cell block is a memory section.

24. A device according to claim 16, wherein said primary memory cell block is a memory section.

25. A non-volatile semiconductor memory device comprising a memory cell array in which a plurality of memory cells are arranged, said plurality of memory cells containing two or more types of memory cells, said memory cells each comprising source-drain regions provided apart from each other in a semiconductor substrate having a conductivity type, said source-drain regions having a conductivity type opposite to that of the semiconductor substrate, a floating gate provided above at least a channel region disposed between said source-drain regions, and a control gate provided above a surface of said floating gate, wherein the floating gate of a first memory cell differs from that of a second memory cell in area covering said semiconductor substrate; and the source-drain regions of each memory cell is not self-aligned by the floating gate thereof.

26. A non-volatile semiconductor memory device comprising a memory cell array in which a plurality of memory cells are arranged, said memory cell array including at least two memory cell groups, each group comprising a plurality of memory cells, each cell comprising source-drain regions provided apart from each other in a semiconductor substrate having a conductivity type, said source-drain regions having a conductivity type opposite to that of the semiconductor substrate, a floating gate provided above at least a channel region disposed between said source-drain regions, and a control gate provided above a surface of said floating gate, wherein the floating gate of a first memory cell differs from that of a second memory cell in area covering said semiconductor substrate; and the source-drain regions of each memory cell is not self-aligned by the floating gate thereof.

27. A non-volatile semiconductor memory device comprising a memory cell array in which a plurality of memory cells are arranged, said memory cell array being divided into a plurality of blocks, each memory cell comprising source-drain regions provided apart from each other in a semiconductor substrate having a conductivity type, said source-drain regions having a conductivity type opposite to that of the semiconductor substrate, a floating gate provided above at least a channel region disposed between said source-drain regions, and a control gate provided above a surface of said floating gate and being formed in a block of said plurality of blocks, wherein the floating gate of a first memory cell differs from that of a second memory cell in the area covering said semiconductor substrate; and the source-drain regions of each memory cell is not self-aligned by the floating gate thereof.

* * * * *